United States Patent [19]

Iio

[11] Patent Number: 5,469,380
[45] Date of Patent: Nov. 21, 1995

[54] SEMICONDUCTOR MEMORY

[75] Inventor: Masaya Iio, Itami, Japan

[73] Assignee: Mitsubishi Denki Kabushiki Kaisha, Tokyo, Japan

[21] Appl. No.: 179,666

[22] Filed: Jan. 11, 1994

[30] Foreign Application Priority Data

Jan. 18, 1993 [JP] Japan ................ 5-005532

[51] Int. Cl.[6] ................ G11C 11/00
[52] U.S. Cl. ................ 365/154; 365/174; 365/192
[58] Field of Search ................ 365/154, 174, 365/192

[56] References Cited

U.S. PATENT DOCUMENTS 3,660,827  5/1972  Tickle ................ 365/154
5,245,575  9/1993  Sasaki et al. ................ 365/154

FOREIGN PATENT DOCUMENTS 1-205790  8/1989  Japan .
3-263687  11/1991  Japan .

Primary Examiner—David C. Nelms
Assistant Examiner—F. Niranjan
Attorney, Agent, or Firm—Oblon, Spivak, McClelland, Maier & Neustadt

[57] ABSTRACT

A semiconductor memory having NMOS write transistors (16, 14) formed in series between a node (N1) of a memory cell (MC) and a ground level, the gate of the transistor (16) being connected to a write word line (4), the gate of the transistor (14) being connected to a first column write line (12), and NMOS write transistors (17, 15) are formed in series between a node (N2) of the memory cell (MC) and the ground level, the gate of the transistor (17) being connected to the write word line (4), the gate of the transistor (15) being connected to a second column write line (13), to thereby achieve a normal write operation when the power supply voltage is low, with power consumption reduced.

10 Claims, 7 Drawing Sheets

SEMICONDUCTOR MEMORY

BACKGROUND OF THE INVENTION

1. Field of the Invention

The present invention relates to a semiconductor memory such as a multi-port memory.

2. Description of the Background Art

Recently, there have been increasing demands for a multi-port memory which is accessible by a plurality of controllers. Various circuit arrangements have, accordingly, been proposed to achieve the multi-port memory.

FIG. 9 is a block diagram showing the general arrangement of a conventional multi-port memory. Memory cells MC are arranged in matrix form as shown in FIG. 9. Although not shown, the memory cells MC in each row are connected to a write word line and a read word line, and those in each column are connected to a write bit line, a write enable line and a read bit line.

A plurality of memory cell blocks MCB (MCB0 to MCBN) are provided each including 4×8 memory cells MC. The memory cell blocks MCB are provided with writing circuits WC (WC0 to WCN) and reading circuits RC (RC0 to RCN), respectively.

Each of the writing circuits WC sets a bit line potential WBL to be applied to the write bit line and a write enable potential CWE to be applied to the write enable line in the respective columns of the memory cell block MCB, on the basis of a write control signal WEC and a write address WAD which are provided through a write buffer WB and input data DI (DI0 to DIN).

Each of the reading circuits RC selects a read bit line on the basis of a read control signal REC and a read address RAD which are provided through a read buffer RB, and then outputs output data DO (DO0 to DON) on the basis of a read bit line potential RBL given from the selected read bit line.

A write decoder (word line driver) DW selectively activates a write word line on the basis of the write control signal WEC and write address WAD provided through the write buffer WB.

A read decoder (word line driver) DR selectively activates a read word line on the basis of the read control signal REC and read address RAD provided through the read buffer RB.

FIG. 10 is a circuit diagram showing one memory cell MC in the memory cell blocks MCB of FIG. 9 and its associated portions. As shown in FIG. 10, inverters 1 and 2 are cross-connected to each other at their input and output to form the memory cell MC, which stores data given from a node N1 serving as the input of the inverter 1 and outputs the stored data from a node N2 serving as the output of the inverter 1. Reference numeral 3 designates a write bit line to which the write bit line potential WBL is applied; 4 designates a write word line for selecting a row of the memory cells MC in write operation; 5 designates a write NMOS transistor selected by the write word line 4 for transmitting the write bit line potential WBL from the write bit line 3; 6 designates a write enable line for selecting a column of the memory cells MC in write operation; 7 designates an NMOS transistor selected by the write enable line 6 for transmitting the write data to the node N1 of the memory cell MC; 8 designates an inverter for amplifying the data of the memory cell MC to read out the amplified data; 9 designates a read word line for selecting a row of the memory cells MC in read operation; 10 designates a read NMOS transistor selected by the read word line 9 for transmitting the read data from the node N2 of the memory cell MC; and 11 designates a read bit line for transmitting the read data to an output circuit.

The provision of the write bit line 3, the write word line 4, the write enable line 6, the read word line 9, and the read bit line 11 in isolated relation enables the write and read operations to be controlled independently. This provides a 2-port RAM including a write only port and a read only port.

FIG. 11 is a circuit diagram showing the internal arrangement of the writing circuit WC of FIG. 9. The writing circuit WC includes inverters G101 to G110, 3-input NAND gates G111 to G114 and inverters G115 to G118, as shown in FIG. 11. The write control signal WEC is applied to the inverter G101, which in turn outputs the inverted signal to first inputs of the NAND gates G111 to G114. A (write) address A0 is applied to the inverter G102, which in turn outputs the inverted signal to second inputs of the NAND gates G111 and G113. The (write) address A0 is also applied to second inputs of the NAND gates G112 and G114 through the inverters G102 and G103. A (write) address A1 is applied to the inverter G104, which in turn outputs the inverted signal to third inputs of the NAND gates G111 and G112. The (write) address A1 is also applied to third inputs of the NAND gates G113 an G114 through the inverters G104 and G105.

The output of the NAND gate G111 is applied to the inverter G115 which in turn outputs the write enable potential CWE0. The output of the NAND gate G112 is applied to the inverter G116 which in turn outputs the write enable potential CWE1. The output of the NAND gate G113 is applied to the inverter G117 which in turn outputs the write enable potential CWE2. The output of the NAND gate G114 is applied to the inverter G118 which in turn outputs the write enable potential CWE3. It should be noted that i in the CWEi (i=0 to 3) represents the columns of the memory cell block MCB.

The input data DI is transmitted through the inverter G106 and to the inverters G107, G108, G109, G110 which in turn output the write bit line potentials WBL0, WBL1, WBL2, WBL3, respectively. It should be noted that the character i in WBLi (i=0 to 3) represents the columns of the memory cell block MCB.

In the above-mentioned arrangement, the write bit line potential WBL is applied to the write bit line 3 from the writing circuit WC in write operation. The write word line 4 specifies the row of the memory cells MC subjected to the write operation, and the write enable line 6 specifies the column thereof. The NMOS transistors 5 and 7 turn on only for the specified memory cell, which is then written with data. The inverter 2 is designed to have an extremely low output current so as not to prevent the write operation, and the inverters 1 and 2 form a ratio latch.

In read operation, the read word line 9 specifies the row of the memory cells MC, and the NMOS transistor 10 turns on. The data in the memory cell MC is outputted to the read bit line 11. The reading circuit RC selects one of the plurality of read bit lines 11 to output the data of the selected read bit line in read operation in the like manner as the plurality of write enable lines 6 in write operation.

For the NMOS transistors, a gate-source voltage controls a drain-source current, and no current flows between the drain and source when the gate-source voltage is not more than a threshold voltage of the transistors. Normal NMOS transistors are constructed such that the drain and source are symmetrical, the source being of a lower voltage. The threshold voltage of the transistors varies with a potential difference between the source and a well (a region in which the drain and source are formed).

When NMOS transistors are used for inverters or logic gates, the source and well of the NMOS transistors are set to the GND potential, so that the threshold voltage is about 0.7 V. In NMOS transistors used for transfer gates such as transistors 5 and 7, the source potential is sometimes higher than the well potential, resulting in an increasing threshold voltage up to a maximum of about 1.5 V due to back gate effects.

In write operation, the writing circuit WC applies the write bit line potential WBL to the write bit line 3, and "H" (VDD) is applied to the gate of the transistors 5 and 7.

When the write bit line potential WBL is "L" (0 V), the write bit line 3 side of the transistors 5 and 7 serves as the source thereof, and the gate-source voltage of the transistors 5 and 7 is approximately equal to VDD. Thus a sufficient current flows between the drain and source, and the potential at the node N1 serving as the input of the inverter 1 is readily decreased to about 0 V.

On the other hand, when the write bit line potential WBL is "H" (VDD), the input voltage of the inverter 1 is increased through the transistors 5 and 7, and the inverter 1 side of the transistors 5 and 7 serves as the source thereof. The input voltage of the inverter 1 increases up to only the gate voltage of the transistors 5 and 7 minus the threshold voltage thereof. Further, the threshold voltage of the transistor increases due to a back gate voltage applied thereto as the source potential increases.

For correct "H" write operation, the potential at the node N1 serving as the input of the inverter 1 should be more than the threshold voltage of the inverter 1. The threshold voltage of the inverter 1, which may vary in the range of about ⅓VDD to ⅔VDD in accordance with the drive capability ratio of the two transistors forming the inverter 1, is set to about ½VDD for case of write operation because the "H" write operation is difficult in the circuit of FIG. 10. It has been confirmed by circuit simulation that, because the speed decreases abruptly as the memory approaches the operation limit, a voltage of ½VDD or more is required to be applied to the input of the inverter 1 for "H" write operation at practical speeds, and a voltage of ⅙VDD or less is sufficient for "L" write operation.

In "L" write operation, the input voltage of the inverter 1 is enabled to decrease to about 0.3 V without difficulty, there being no problem of write operation in the VDD range of 2 to 5 V.

In "H" write operation, however, the input voltage of the inverter 1 varies with the back gate voltage as described above. Assuming that the power supply voltage VDD is 3 V or less, the input voltage of the inverter 1 decreases to about (VDD−1.2) V. When VDD<2.4 V, the input voltage of the inverter 1 is not more than ½VDD, so that the normal write operation is difficult.

In application to a practical chip, the VDD of up to about 2.8 V allows the "H" write operation at sufficient speeds because of influences of power supply voltage drop in the chip, wafer process variation and characteristic changes with temperatures. For the forgoing masons, this memory cell construction, though applicable to VDD=3.3 V±0.3 V, is difficult to be applied to VDD=3.0 V ±0.3 V. It is not suitable for use with low power supply voltages in consideration for the use of batteries and the further decrease of voltage in the future.

The conventional semiconductor memories such as multi-port memories as above constructed is disadvantageous in that difficulty comes in the write operation when the power supply voltage is low.

Next, we will look into the power consumption of the RAM. In general, the power consumption of a RAM is determined by the current for charging and discharging the parasitic capacitance of the bit and word lines and the current carried by a sense amplifier. The latter current may be set in accordance with the required operating speeds, and the former current is determined by the product of the parasitic capacitance and the number of potential changes for the line.

In the memory cell arrangement of the conventional semiconductor memories such as multi-port memories, potentials at the write word lines, write bit lines and write enable lines vary once for every one or two write cycles, and potentials at the read word lines and read bit lines vary once for every one or two read cycles.

Potentials vary at only the write word lines and read word lines corresponding to the row to be accessed and at only the write enable lines corresponding to the column to be accessed. It is, however, general that potentials vary at the write bit lines and read bit lines corresponding to all columns.

In particular, the write bit lines are of greater amplitude than the read bit lines. This is because the "H" level of the read bit lines is decreased from VDD by the threshold voltage of the NMOS transistor 10. In addition, potentials at the write bit lines vary in response to data input changes when no write operation occurs, resulting in maximum power consumption.

A circuit arrangement is possible in which potentials vary at only the write bit lines in the column which is required to be written. This is, however, not practical because of the complexity of the circuit and the possibility of increased delay in write operation resulting from the potential variation at the write bit lines being later than that at the write enable lines.

SUMMARY OF THE INVENTION

According to the present invention, a semiconductor memory comprises: a first power supply for supplying a first power supply voltage; a second power supply for supplying a second power supply voltage lower than the first power supply voltage; a plurality of memory cells each including first and second inverters in which "H" and "L" are specified respectively by the first and second power supply voltages, the first and second inverters being cross connected at their input and output, the input of the first inverter being a first node, the input of the second inverter being a second node; a plurality of first switching means of a predetermined conductivity type provided in corresponding relation to the plurality of memory cells and each formed between a write power supply which is one of the first and second power supplies and the first node, each of the first switching means being capable of transmitting a write voltage of the write power supply when it is on; a plurality of second switching means of the predetermined conductivity type provided in corresponding relation to the plurality of memory cells and each formed between the write power supply and the second node; and write control means for selecting one of the plurality of memory cells as a selected memory cell on the basis of an external address signal and selecting a pair of the first and second switching means which is in corresponding relation to the selected memory cell as selected first and second switching means, to turn on one of the selected first and second switching means and turn off the other selected switching means on the basis of external write data in write operation.

The write control means of the semiconductor memory of the present invention selects one of the plurality of memory cells as the selected memory cell on the basis of the external address input and selects a pair of the first and second switching means which is in corresponding relation to the selected memory cell as the selected first and second switching means, to turn on one of the selected first and second switching means and turn off the other selected switching means on the basis of the external write data in write operation.

When the selected first switching means turns on, the write voltage is applied to the first node of the selected memory cell. When the selected second switching means turns on, the write voltage is applied to the second node of the selected memory cell. Thus the write operation is performed into the selected memory cell on the basis of the write data.

The predetermined conductivity type of the first and second switching means is such that the write power supply voltage is transmitted without being changed by the threshold voltage of the switching means and back gate effects in the on-state. Suitable setting of the drive capability ratio of the switching means to the memory cells enables the write voltage to be impressed on the first or second node of the selected memory cell substantially intactly.

As a result, write operations can be performed even if the potential difference is small between the first and second power supply voltages.

Since the write control means carries out the selection of the memory cells and write operation at the same time, the memory cells not to be written are not subjected to the potential setting based on the write data.

The current consumption is suppressed which is generated by the conventional technique in which the memory cell to be written is selected after the potential setting based on the write data, to accordingly reduce the power consumption.

In another aspect of the present invention, the semiconductor memory comprises: a first power supply for supplying a first power supply voltage; a second power supply for supplying a second power supply voltage lower than the first power supply voltage; a plurality of memory cells each including first and second inverters in which "H" and "L" are specified respectively by the first and second power supply voltages, the first and second inverters being cross connected at their input and output, the input of the first inverter being a first node, the input of the second inverter being a second node; a plurality of first switching means of a first conductivity type provided in corresponding relation to the plurality of memory cells and each formed between a first write power supply which is one of the first and second power supplies and the first node, each of the first switching means being capable of transmitting a first write voltage of the first write power supply when it is on; a plurality of second switching means of a second conductivity type provided in corresponding relation to the plurality of memory cells and each formed between a second write power supply which is the other power supply and the first node, each of the second switching means being capable of transmitting a second write voltage of the second write power supply when it is on; and write control means for selecting one of the plurality of memory cells as a selected memory cell on the basis of an external address signal and selecting a pair of the first and second switching means which is in corresponding relation to the selected memory cell as selected first and second switching means, to turn on one of the selected first and second switching means and turn off the other selected switching means on the basis of external write data in write operation.

The write control means of the semiconductor memory according to the second aspect of the present invention selects one of the plurality of memory cells as the selected memory cell on the basis of the external address input and selects a pair of the first and second switching means which is in corresponding relation to the selected memory cell as the selected first and second switching means, to turn on one of the selected first and second switching means and turn off the other selected switching means on the basis of the external write data in write operation.

When the selected first switching means turns on, the first write voltage is applied to the first node of the selected memory cell. When the second switching means turns on, the second write voltage is applied to the first node of the selected memory cell. Since the first and second write voltages are logically inverse, the selected memory cell is subjected to the write operation on the basis of the write data.

The conductivity type of the first and second switching means is such that the first and second write power supply voltages are transmitted without being changed by the threshold voltage of the switching means and the back gate effects. Suitable setting of the drive capability ratio of the switching means to the second inverters permits the first or second write voltage to be impressed on the first node of the selected memory cell substantially intactly.

As a result, write operations can be performed even if the potential difference is small between the first and second power supply voltages.

Since the write control means carries out the selection of the memory cells and write operation at the same time, the memory cells not to be written are not subjected to the potential setting based on the write data.

The current consumption is suppressed which is generated by the conventional technique in which the memory cell to be written is selected after the potential setting based on the write data, to accordingly reduce the power consumption.

An object of the present invention is to provide a semiconductor memory which performs a normal write operation when a power supply voltage is low and which achieves reduction in power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
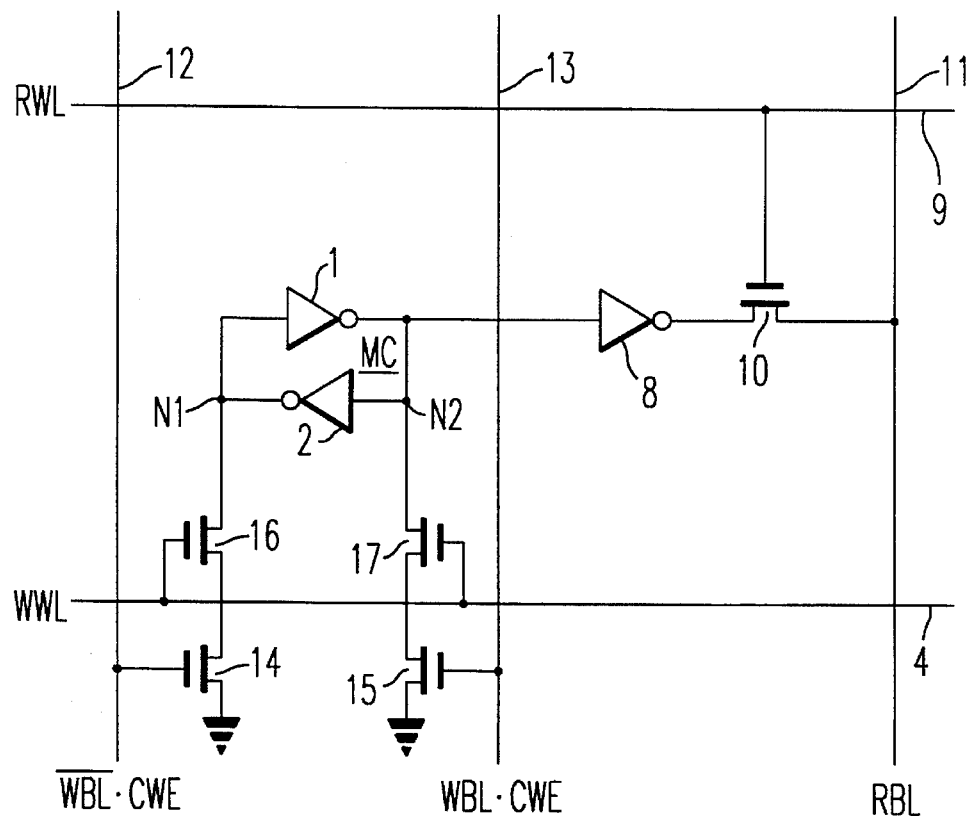
FIG. 1 is a circuit diagram of a memory cell arrangement of a multi-port memory according to a first preferred embodiment of the present invention.

FIG. 1 is a circuit diagram of a memory cell arrangement of a multi-port memory according to a first preferred embodiment of the present invention. The general arrangement of the multi-port memory of FIG. 1 is identical with that of the conventional multi-port memory of FIG. 9.

Referring to FIG. 1, inverters 1 and 2 are cross-connected to each other at their input and output to form a memory cell MC, which stores data given from a node N1 or anode N2. Reference numeral 4 designates a write word line for selecting a row of the memory cells MC in write operation; 8 designates an inverter for amplifying the data of the memory cell MC to read out the amplified data; 9 designates a read word line for selecting a row of the memory cells MC in read operation; 10 designates a read NMOS transistor selected by the read word line 9 for transmitting the read data given from the node N2 of the memory cell MC; 11 designates a read bit line for transmitting the read data to an output circuit; 12 designates a first column write line for use in "L" write operation; and 13 designates a second column write line for use in "H" write operation.

NMOS write transistors 16 and 14 are formed in series between the node N1 of the memory cell MC and the ground level. The gate of the NMOS write transistor 16 is connected to the write word line 4, and the gate of the NMOS write transistor 14 is connected to the first column write line 12. Likewise, NMOS write transistors 17 and 15 are formed in series between the node N2 of the memory cell MC and the ground level. The gate of the NMOS write transistor 17 is connected to the write word line 4, and the gate of the NMOS write transistor 15 is connected to the second column write line 13.

The AND signal of an inverted write bit line potential $\overline{WBL}$ and a write enable potential CWE is applied to the first column write line 12, and the AND signal of a write bit line potential WBL and the write enable potential CWE is applied to the second column write line 13.

Figure 2:
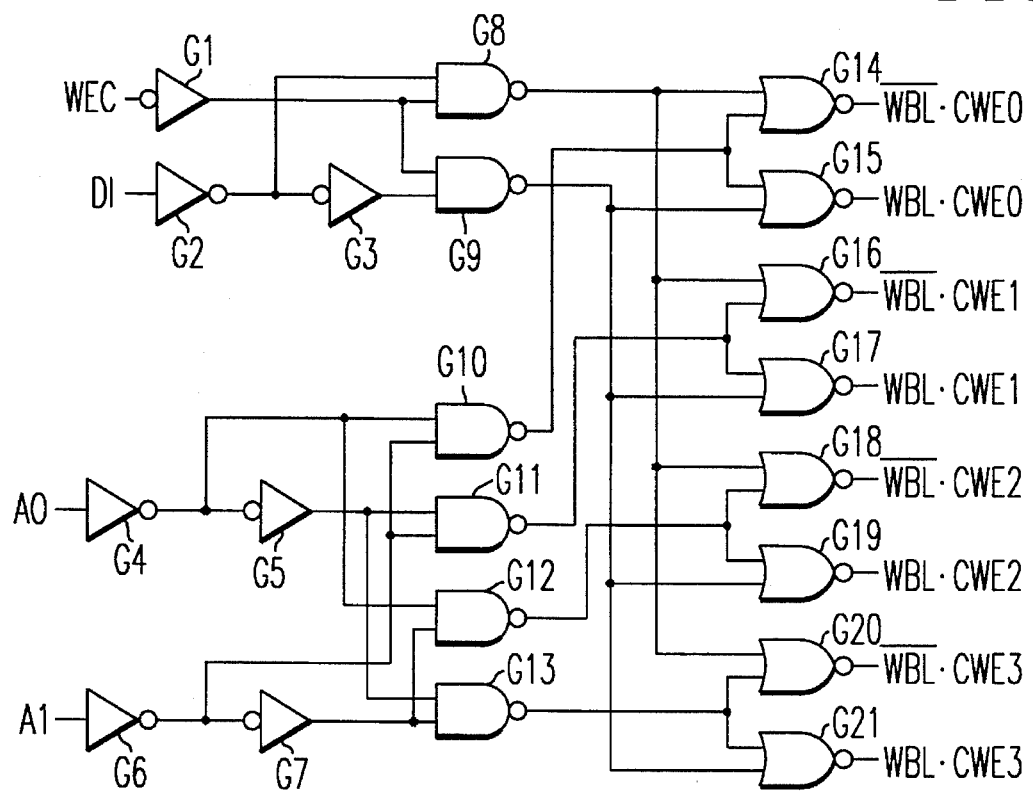
FIG. 2 is a circuit diagram showing the internal arrangement of a writing circuit of the first preferred embodiment.

FIG. 2 is a circuit diagram showing the internal arrangement of a writing circuit WC for applying a write signal to the first and second column write lines 12 and 13. The writing circuit WC includes inverters G1 to G7, NAND gates G8 to G13, and NOR gates G14 to G21, as shown in FIG. 2.

A write control signal WEC is applied to the inverter G1, which in turn outputs the inverted signal to the NAND gates G8 and G9. Input data DI is applied to the inverter G2, which in turn outputs the inverted signal to the NAND gate G8. The input data DI is also applied to the NAND gate G9 through the inverters G2 and G3.

A (write) address A0 is applied to the inverter G4, which in turn outputs the inverted signal to the NAND gates G10 and G12. The (write) address A0 is also inputted to the NAND gates G11 and G13 through the inverters G4 and G5. A (write) address A1 is applied to the inverter G6, which in turn outputs the inverted signal to the NAND gates G10 and G11. The (write) address A1 is also inputted to the NAND gates G12 and G13 through the inverters G6 and G7.

The output of the NAND gate G8 is inputted to the NOR gates G14, G16, G18, and G20. The output of the NAND gate G9 is inputted to the NOR gates G15, G17, G19, and G21. The output of the NAND gate G10 is inputted to the NOR gates G14 and G15. The output of the NAND gate G11 is inputted to the NOR gates G16 and G17. The output of the NAND gate G12 is inputted to the NOR gates G18 and G19. The output of the NAND gate G13 is inputted to the NOR gates G20 and G21.

As a result, the output of the NOR gate G14 is ($\overline{WBL}$.CWE0); the output of the NOR gate G15 is (WBL.CWE0); the output of the NOR gate G16 is ($\overline{WBL}$.CWE1); the output of the NOR gate G17 is (WBL.CWE1); the output of the NOR gate G18 is ($\overline{WBL}$.CWE2); the output of the NOR gate G19 is (WBL.CWE2); the output of the NOR gate G20 is ($\overline{WBL}$.CWE3); and the output of the NOR gate G21 is (WBL.CWE3). It should be noted that the character i in CWEi (i=0 to 3) represents the columns of the memory cell block MCB (See FIG. 9).

Figure 3:
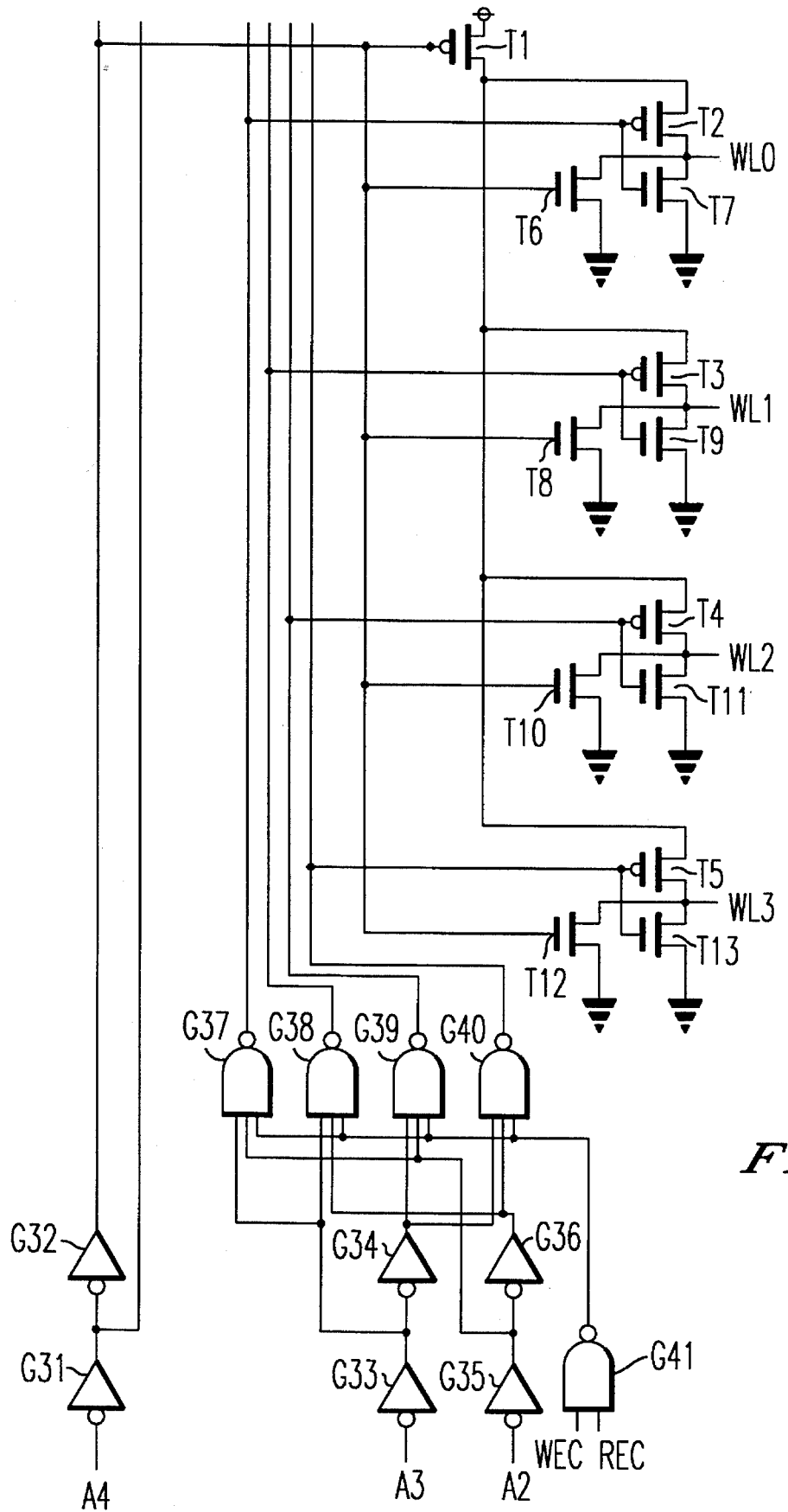
FIG. 3 is a circuit diagram showing the internal arrangement of a decoder of the first preferred embodiment.

FIG. 3 is a circuit diagram showing the internal arrangement of a (write/read) decoder. The decoder includes inverters G31 to G36, 3-input NAND gates G37 to G40, a 2-input NAND gate G41, and transistors T1 to T13, as shown in FIG. 3.

A (write/read) address A4 is applied to the gates of the PMOS transistor T1 and NMOS transistors T6, T8, T10, T12 through the inverters G31 and G32.

A (write/read) address A3 is applied to the inverter G33, which in turn outputs the inverted signal to first inputs of the NAND gates G37 and G38. The (write/read) address A3 is also applied to first inputs of the NAND gates G39 and G40 through the inverters G33 and G34. A (write/read) address A2 is applied to the inverter G35, which in turn outputs the inverted signal to second inputs of the NAND gates G37 and G39. The (write/read) address A2 is also applied to second inputs of the NAND gates G38 and G40 through the inverters G35 and G36.

In the (write/read) decoder of FIG. 3, the NAND gate G41 receives the write control signal WEC and a read control signal REC. The output of the NAND gate G41 is applied to third inputs of the NAND gates G37 to G40. It should be noted that each of the write only port and read only port as shown in FIG. 1, if provided, has a write decoder or a read decoder. In this case, the NAND gate G41 is replaced with an inverter which receives the write control signal WEC in the write decoder and receives the read control signal REC in the read decoder.

The PMOS transistor T1 has a source connected to the power supply VDD and a drain connected to the sources of the PMOS transistors T2 to T5 in common. The PMOS transistor T2 has a drain connected to the drains of the NMOS transistors T6 and T7 in common, the sources of the NMOS transistors T6 and T7 being grounded. The PMOS transistor T3 has a drain connected to the drains of the NMOS transistors T8 and T9 in common, the sources of the NMOS transistors T8 and T9 being grounded. The PMOS transistor T4 has a drain connected to the drains of the NMOS transistors T10 and T11 in common, the sources of the NMOS transistors T10 and T11 being grounded. The PMOS transistor T5 has a drain connected to the drains of the NMOS transistors T12 and T13 in common, the sources of the NMOS transistors T12 and T13 being grounded.

Signals outputted from the drains of the PMOS transistors T2 to T5 are word line potentials WL0 to WL3 to be applied to previously associated (write/read) word lines, respectively.

The output of the NAND gate G37 is impressed on the gates of the PMOS transistor T2 and NMOS transistor T7. The output of the NAND gate G38 is impressed on the gates of the PMOS transistor T3 and NMOS transistor T9. The output of the NAND gate G39 is impressed on the gates of the PMOS transistor T4 and NMOS transistor T11. The output of the NAND gate G40 is impressed on the gates of the PMOS transistor T5 and NMOS transistor T13.

With such an arrangement in the (write/read) decoder, one of the word line potentials WL0 to WL3 is selectively made high on the basis of the addresses A3 and A2, as shown in Table 1, when at least one of the write and read control signals WEC and REC is "L" (active) and the address A4 is "0". Likewise, one of the word line potentials WL0 to WL3 is selectively made high in the write decoder, as shown in Table 1, when the write control signal WEC is "L" and the address A4 is "0".

TABLE 1

| A4 | A3 | A2 | WL3 | WL2 | WL1 | WL0 |
|----|----|----|-----|-----|-----|-----|
| 0  | 0  | 0  | L   | L   | L   | H   |
| 0  | 0  | 1  | L   | L   | H   | L   |
| 0  | 1  | 0  | L   | H   | L   | L   |
| 0  | 1  | 1  | H   | L   | L   | L   |

Figure 9:
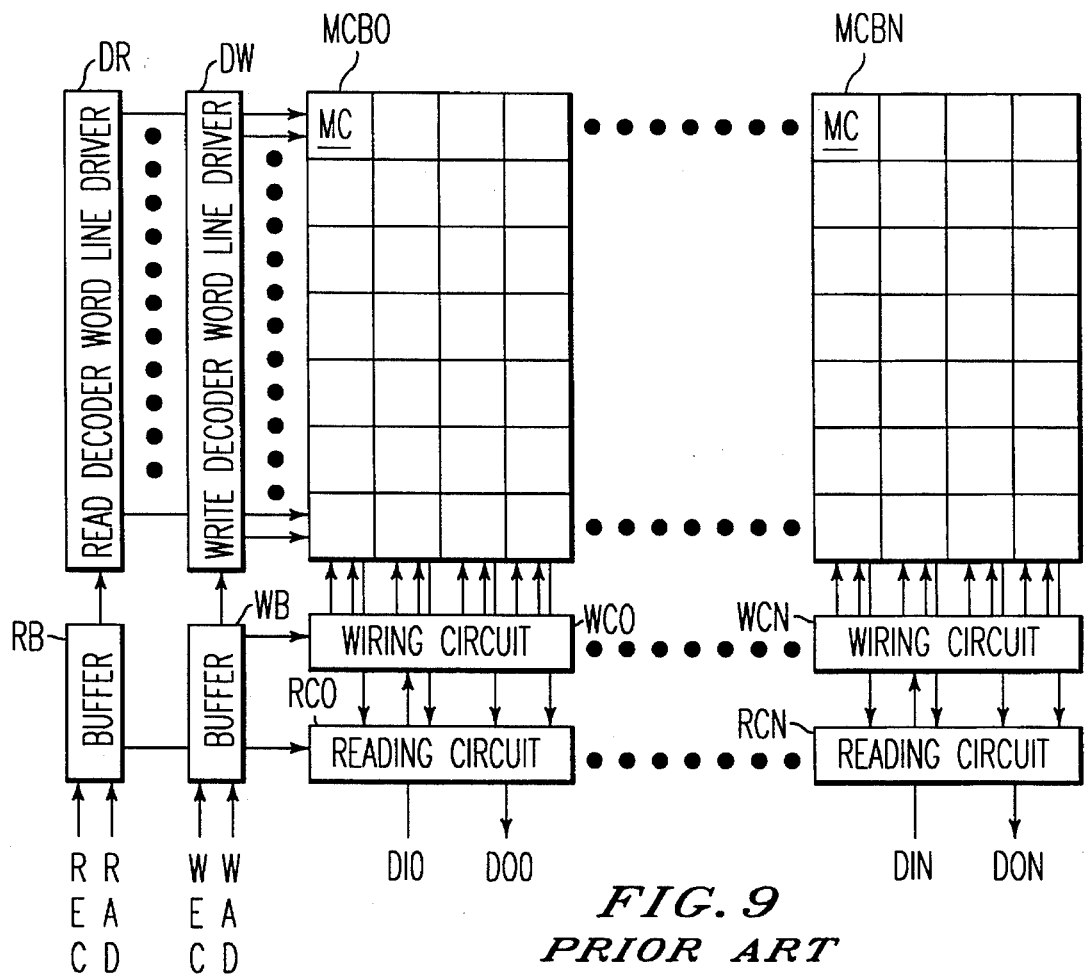
FIG. 9 is a block diagram showing the general arrangement of the multi-port memory.
Figure 10:
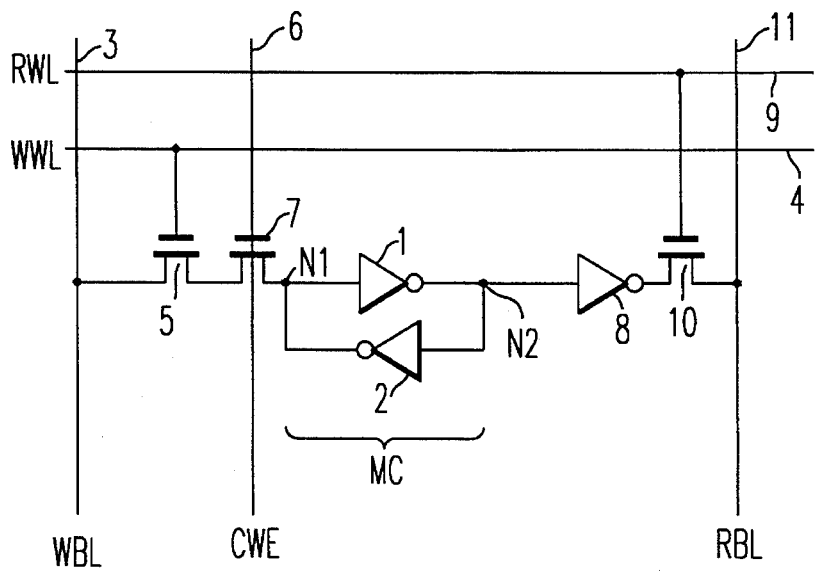
FIG. 10 is a circuit diagram of a memory cell arrangement of a conventional multi-port memory.
Figure 11A:
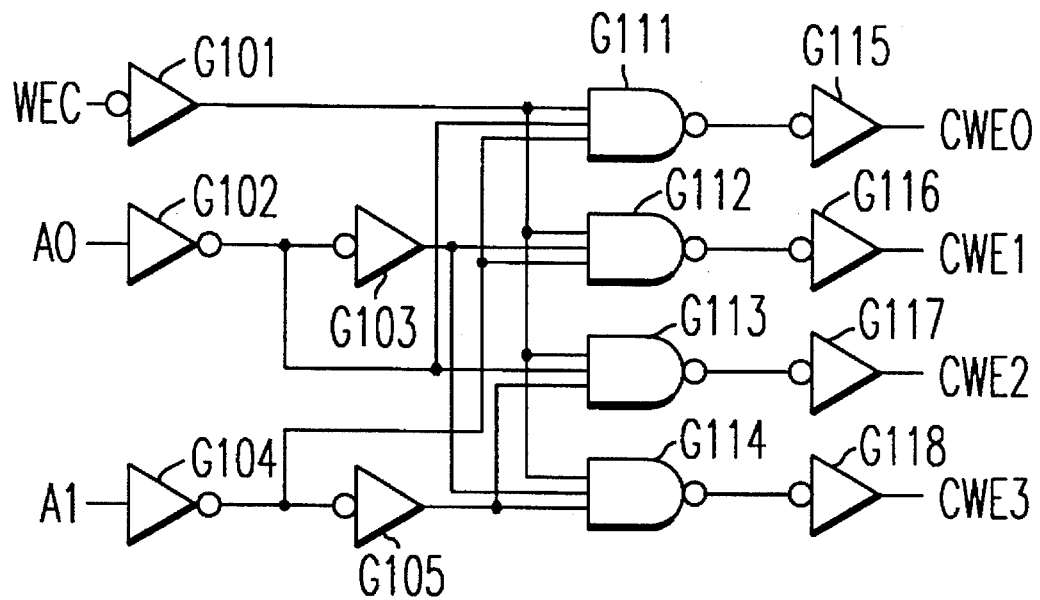
FIG. 11 is a circuit diagram showing the internal arrangement of a conventional writing circuit.
Figure 11B:
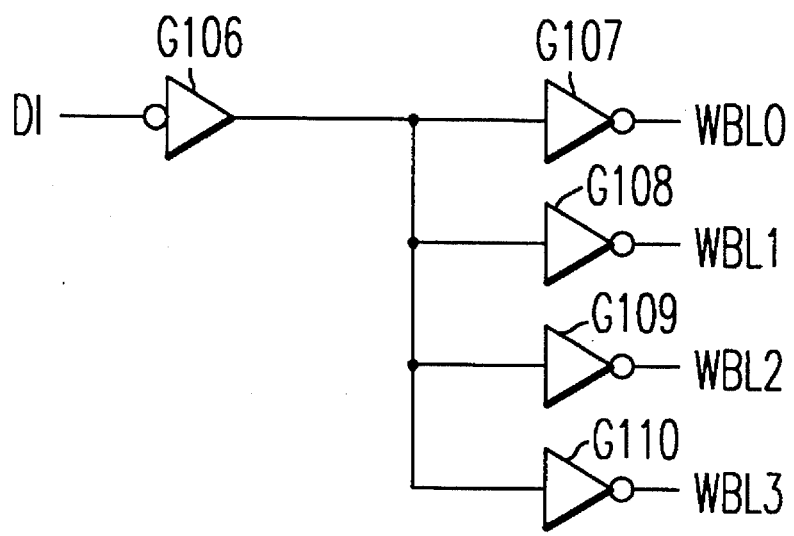

It should be noted that the character j in WLj (j=0 to 3) corresponds to one row of the memory cell block MCB (See FIG. 9).

In practice, circuits equivalent to the transistors T1 to T13 are provided additionally, and the output of the inverter G31, which is the inverted signal of A4, is applied to the gates of the transistors equivalent to the transistors T1, T6, T8, T10, T12, whereby one of four other word line potentials is selectively made high on the basis of the addresses A3 and A2 when the address A4 is "1", although not shown in FIG. 3.

In the multi-port memory constructed as above described, the write word line 4 corresponding to the row of the memory cell MC to be written is set to "H" and the write enable potential CWE corresponding to the column of the memory cell MC to be written is set to "H" in write operation.

In "L" write operation, the input data DI is "L" and, accordingly, the write bit line potential WBL is "L". Thus, the potential at the selected first column write line 12 is "H" and the potential at the selected second column write line 13 is "L". The potentials at unselected first and second column write lines 12 and 13 are all "L". Only the write word line corresponding to the selected row is "H".

Consequently, in the selected memory cell MC, the NMOS write transistors 14, 16, 17 turn on and the NMOS write transistor 15 turns off, the potential at the node N1 being set to the ground level through the write transistors 16 and 14. Then, the memory cell MC is written with "L".

In "H" write operation, the input data DI is "H" and, accordingly, the write bit line potential WBL is "H". Thus the potential at the selected first column write line 12 is "L" and the potential at the selected second column write line 13 is "H".

Consequently, in the selected memory cell MC, the NMOS write transistors 15, 16, 17 turn on and the NMOS write transistor 14 turns off, the potential at the node N2 being set to the ground level through the write transistors 17 and 15. Then, the output of the inverter 2 is necessarily "H", which is applied to the node N1. The memory cell MC is written with "H".

The unselected memory cells MC, in which at least one of the word line potential WWL at the write word line 4 and write enable potential CWE is "L", are not subjected to the write operation.

Pull-up transistors for the inverters 1 and 2 are designed to conduct less current than the write transistors 14 to 17 so as not to prevent the write operation.

In one pair of the transistors 14, 16 and 15, 17 which are both on, the ground level side serves as a source and the memory cell MC side serves as a drain in write operation. Thus, VDD is applied between the gate and source of the write transistor 14 or 15 and the drain voltage decreases to about 0 V. This causes the voltage between the gate and source of the write transistor 16 or 17 to approach VDD, to decrease the potential at the node N1 or N2 to about 0 V. The drain voltage of the NMOS write transistors 14 to 17 is sufficiently lowered, there being no problem of the back gate voltage.

As above described, the "L" propagation processing is carried out by the NMOS transistors independently of the data written into the memory cell MC. The voltage sufficiently less than the threshold voltage of the inverter 1 or 2 is transmitted even if the power supply voltage VDD is low, e.g. 3.0 V or less, thereby achieving the normal write operation.

For purposes of explanation, the write operation is described hereinabove assuming that the write bit line potential WBL and the write enable potential CWE are determined independently. In practice, however, the signals required for the first and second column write lines 12 and 13 are the AND signal of the write bit line potential WBL and write enable potential CWE and the AND signal of the inverted write bit line potential $\overline{WBL}$ and write enable potential CWE. Therefore, the writing circuit WC having the arrangement of FIG. 2 is enabled to perform the write operation without hindrance.

Description will now be given on current consumption. The conventional memory cell arrangement has been such that the write operation is not performed until potentials are set at both the write bit line and the write enable line. To perform the write operation rapidly after the rising of the write enable line, it has been necessary to previously set the potential at the write bit line in accordance with the input data. However, the provision of the write bit lines in independent relation to the write enable function has caused the potentials at all write bit lines to vary in the columns and cycles which need not be written, thereby cause charging and discharging of all of the associated parasitic capacitances, resulting in increasing power supply current.

In the memory cell arrangement of the first preferred embodiment, only the potential at the column write line to be written should be varied in the column direction to perform the write operation.

The need to take the timing difference between the lines into account is, consequently, eliminated. Wasteful current consumption is suppressed which occurs by the conventional technique in which the memory cell to be written is selected after the potential setting based on the write data to all of the column lines, accordingly reducing the power consumption.

Second Preferred Embodiment

Figure 4:
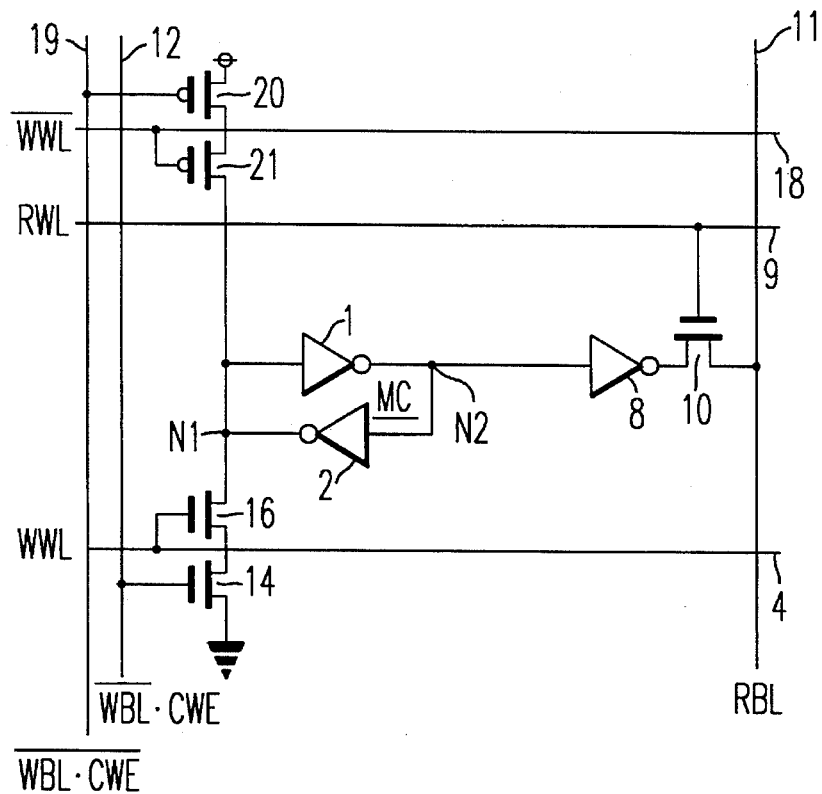
FIG. 4 is a circuit diagram of the memory cell arrangement of the multi-port memory according to a second preferred embodiment of the present invention.

FIG. 4 is a circuit diagram of the memory cell arrangement of the multi-port memory according to a second preferred embodiment of the present invention. The general arrangement of the multi-port memory of FIG. 4 is identical with that of the conventional memory of FIG. 9.

Referring to FIG. 4, the inverters 1 and 2 are cross-connected to each other at their input and output to form a memory cell MC, which stores data given from the node N1 serving as the input of the inverter 1 and outputs the stored data from the node N2 serving as the output of the inverter 1. Reference numeral 4 designates a write word line for selecting a row of the memory cells MC in write operation; 8 designates an inverter for amplifying the data of the memory cell MC to read out the amplified data; 9 designates a read word line for selecting a row of the memory cells MC in read operation; 10 designates a read NMOS transistor selected by the read word line 9 for transmitting the read data given from the node N2 of the memory cell MC; 11 designates a read bit line for transmitting the read data to an output circuit; 12 designates a first column write line for used in "L" write operation; 18 designates an inverted write word line receiving the inverted potential $\overline{WWL}$ of the write word line potential WWL; and 19 designates a second column write line for use in "H" write operation.

The NMOS write transistors 16 and 14 are formed in series between the node N1 of the memory cell MC and the ground level. The gate of the NMOS write transistor 16 is connected to the write word line 4, and the gate of the NMOS write transistor 14 is connected to the first column write line 12. PMOS write transistors 21 and 20 are formed in series between the node N1 of the memory cell MC and the power supply VDD. The gate of the PMOS write transistor 21 is connected to the inverted write word line 18, and the gate of the PMOS write transistor 20 is connected to the second column write line 19.

The AND signal of the inverted write bit line potential $\overline{WBL}$ and write enable potential CWE is applied to the first column write line 12, and the NAND signal of the write bit line potential WBL and write enable potential CWE is applied to the second column write line 19.

Figure 5:
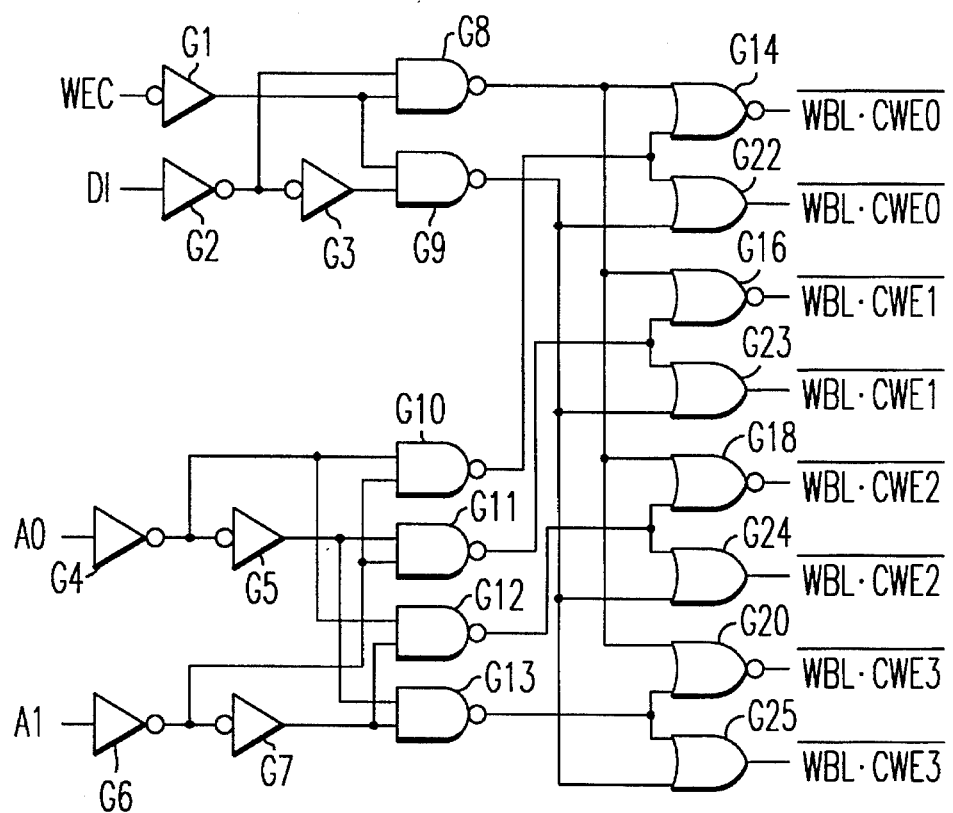
FIG. 5 is a circuit diagram showing the internal arrangement of the writing circuit of the second preferred embodiment.

FIG. 5 is a circuit diagram showing the internal arrangement of the writing circuit WC for applying the write signal to the first column write line 12 and second column write line 19. The writing circuit WC includes the inverters G1 to G7, the NAND gates G8 to G13, the NOR gates G14, G16, G18, G20 and OR gates G22 to G25, as shown in FIG. 5.

The internal arrangement of the writing circuit WC of FIG. 5 is substantially the same as that of the first preferred embodiment writing circuit WC of FIG. 2 except that the OR gates G22, G23, G24, G25 are substituted for the NOR gates G15, G17, G19, G21, respectively. Other arrangements of the writing circuit WC of the second preferred embodiment are identical with those of the first preferred embodiment writing circuit WC.

As a result, the output of the NOR gate G14 is (WBL.CWE0); the output of the OR gate G22 is $\overline{(WBL.CWE0)}$; the output of the NOR gate G16 is (WBL.CWE1); the output of the OR gate G23 is $\overline{(WBL.CWE1)}$; the output of the NOR gate G18 is (WBL.CWE2); the output of the OR gate G24 is $\overline{(WBL.CWE2)}$; the output of the NOR gate G20 is (WBL.CWE3); and the output of the OR gate G25 is $\overline{(WBL.CWE3)}$. It should be noted that the character i in CWEi (i=0 to 3) represents the columns of the memory cell block MCB (See FIG. 9).

Figure 6:
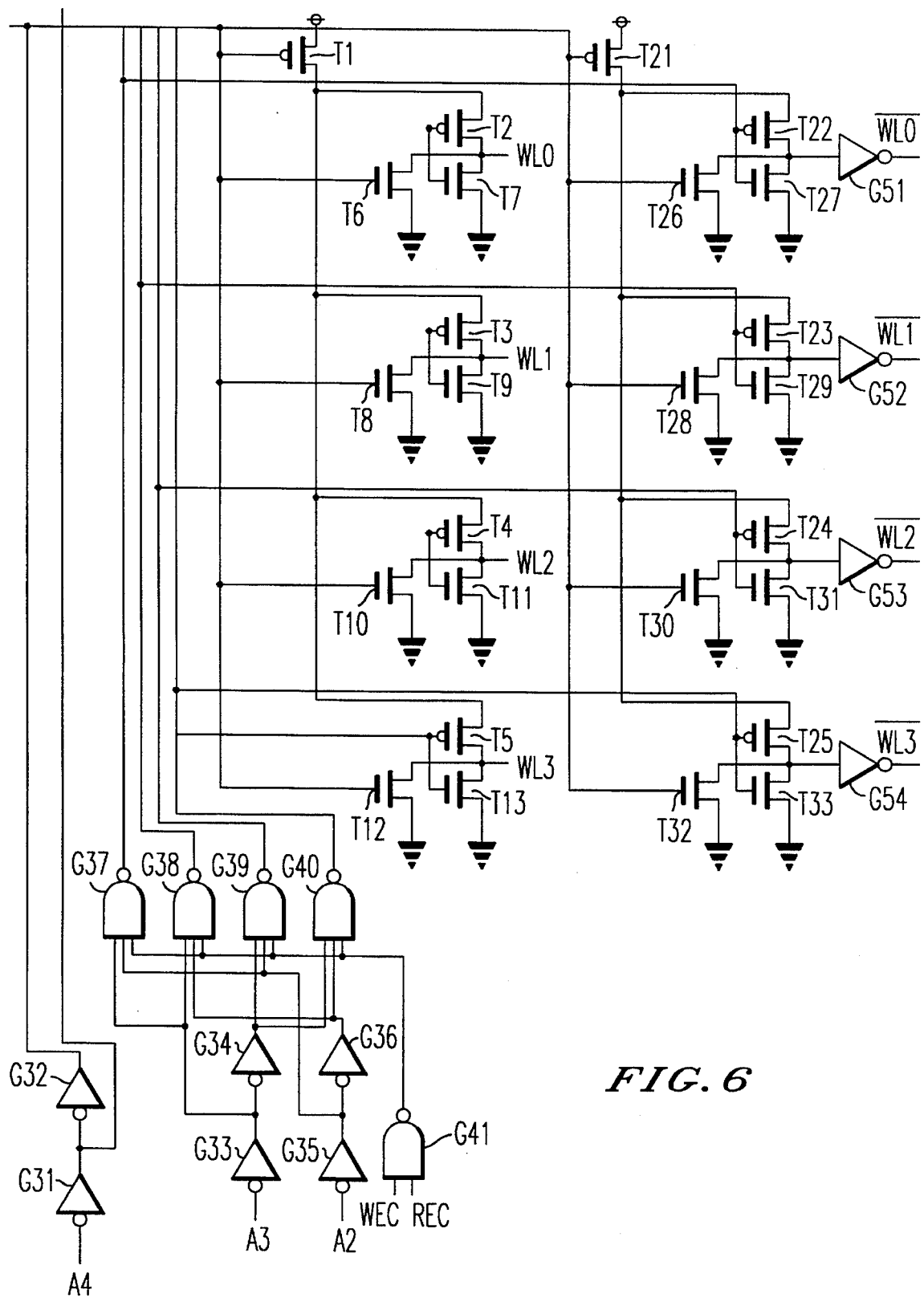
FIG. 6 is a circuit diagram showing the internal arrangement of a write/read decoder of the second preferred embodiment.

FIG. 6 is a circuit diagram showing the internal arrangement of the (write/read) decoder. The decoder includes the inverters G31 to G36, the 3-input NAND gates G37 to G40, the 2-input NAND gate G41, transistors T1 to T13, T21 to T33, and inverters G51 to G54, as shown in FIG. 6.

The (write/read) decoder of FIG. 6 includes all of the elements of the decoder of FIG. 3. Only the portions appended in the second preferred embodiment to the decoder of FIG. 3 will be discussed below.

The PMOS transistor T21 has a source connected to the power supply VDD and a drain connected to the sources of the PMOS transistors T22 to T25. The PMOS transistor T22 has a drain connected to the drains of the NMOS transistors T26 and T27 in common, the sources of the NMOS transistors T26 and T27 being grounded. The PMOS transistor T23 has a drain connected to the drains of the NMOS transistors T28 and T29 in common, the sources of the NMOS transistors T28 and T29 being grounded. The PMOS transistor T24 has a drain connected to the drains of the NMOS transistors T30 and T31 in common, the sources of the NMOS transistors T30 and T31 being grounded. The PMOS transistor T25 has a drain connected to the drains of the NMOS transistors T32 and T33 in common, the sources of the NMOS transistors T32 and T33 being grounded.

Signals from the drains of the PMOS transistors T22 to T25 are applied to the inputs of the inverters G51 to G54, respectively. The output signals from the inverters G51 to G54 are inverted word line potentials $\overline{WL0}$ to $\overline{WL3}$ to be applied to the previously associated inverted write word line 18, respectively.

The output of the NAND gate G37 is impressed on the gates of the PMOS transistor T22 and NMOS transistor T27. The output of the NAND gate G38 is impressed on the gates of the PMOS transistor T23 and NMOS transistor T29. The output of the NAND gate G39 is impressed on the gates of the PMOS transistor T24 and NMOS transistor T31. The output of the NAND gate G40 is impressed on the gates of the PMOS transistor T25 and NMOS transistor T33.

With such arrangements, one of the word line potentials WL0 to WL3 is selectively made high and one of the inverted word line potentials $\overline{WL0}$ to $\overline{WL3}$ is selectively made low on the basis of the addresses A3 and A2 when at least one of the write control signal WEC and read control signal REC is "L" (active) and the address A4 is "0".

It should be noted that the character j in WLj, $\overline{WLj}$ (j=0 to 3) corresponds to one row of the memory cell block MCB. The arrangement of the read decoder of the second preferred embodiment may be the same as that of the first preferred embodiment. The write decoder is designed such that the NAND gate G41 of FIG. 6 is replaced with an inverter which receives the write control signal WEC.

In the multi-port memory having such arrangements, the write word line 4 corresponding to the row of the memory cell MC to be written is set to "H", the inverted write word line 18 is set to "L", and the write enable potential CWE corresponding to the column of the memory cell MC to be written is set to "H" in write operation.

In "L" write operation, the input data DI is "L" and, accordingly, the write bit line potential WBL is "L". Thus, the potentials at the selected first and second column write lines 12 and 19 are both "H". The potentials at the unselected first column write lines 12 are "L" and the potentials at the unselected second column write lines 19 are "H".

Consequently, the NMOS write transistors 14 and 16 turn on and the PMOS write transistor 20 turns off. The potential at the node N1 is set to the ground level through the write transistors 16 and 14. Then, the memory cell MC is written with "L".

In "H" write operation, the input data DI is "H" and, accordingly, the write bit line potential WBL is "H". Thus, the potentials at the selected first and second column write lines 12 and 19 are both "L".

Consequently, the PMOS write transistors 20 and 21 turn on and the NMOS write transistor 14 turns off. The potential at the node N1 is set to the power supply voltage VDD through the write transistors 20 and 21. Then, the memory cell MC is written with "H".

The unselected memory cells, in which at least one of the word line potential WWL at the write word line 4 and write enable potential CWE is "L", are not subjected to the write operation.

The transistors of the inverter 2 are designed to conduct less current than the write transistors 14 to 17 so as not to prevent the write operation.

In "L" write operation, the ground level side serves as a source and the memory cell MC side serves as a drain in the write transistors 14 and 16 which are on. Thus, VDD is applied between the gate and source of the write transistor 14, and the drain voltage decreases to about 0 V. This causes the voltage between the gate and source of the write transistor 16 to approach VDD, to decrease the potential at the node N1 to about 0 V. The drain voltage of the NMOS write transistors 14 and 16 is sufficiently lowered, there being no problem of the back gate voltage.

In "H" write operation, the power supply voltage VDD side serves as a source and the memory cell MC side serves as a drain in the write transistors 20 and 21 which are on. Thus, −VDD is applied between the gate and source of the write transistor 20, and the drain voltage increases to about VDD. This causes the gate-source voltage of the write transistor 21 to approach −VDD, to increase the potential at the node N1 to about VDD. The drain voltage of the PMOS write transistors 20 and 21 is sufficiently raised, there being no problem of the back gate voltage.

The voltage provided is sufficiently less/more than the threshold voltage of the inverter 1 even if the power supply voltage VDD is low, e.g. 3.0 V or less, achieving the normal write operation in the same manner as the first preferred embodiment.

For purposes of explanation, the write operation is discussed hereinabove assuming that the write bit line potential WBL and the write enable potential CWE are determined independently. In practice, however, the signals required for the first and second column write lines 12 and 19 are the AND signal of the inverted write bit line potential $\overline{WBL}$ and write enable potential CWE and the NAND signal of the write bit line potential WBL and write enable potential CWE. Therefore the writing circuit WC of FIG. 5 is enabled to perform the write operation without hindrance.

Further, the potential at only the column write line to be written should be varied in the column direction to perform the write operation, in the same fashion as the first preferred embodiment. Wasteful current consumption is suppressed which occurs by the conventional technique in which the memory cell to be written is selected after the potential setting based on the write data to all of the column lines, to accordingly reduce the power consumption.

Third Preferred Embodiment

Figure 7:
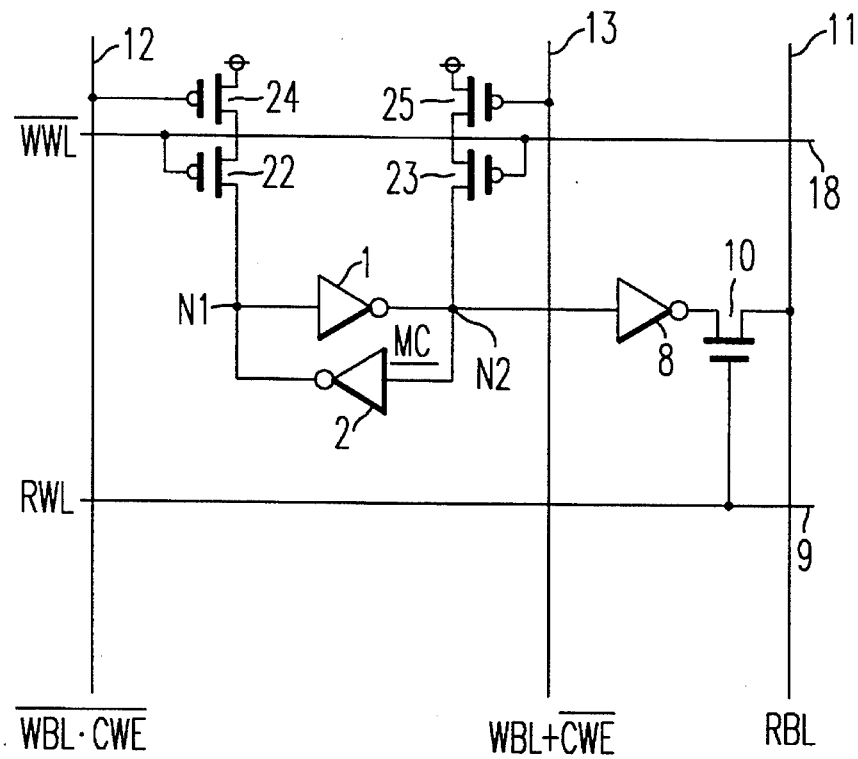
FIG. 7 is a circuit diagram of the memory cell arrangement of the multi-port memory according to a third preferred embodiment of the present invention.

FIG. 7 is a circuit diagram of the memory cell arrangement of the multi-port memory according to a third preferred embodiment of the present invention. The general arrangement of the multi-port memory of FIG. 7 is identical with that of the conventional memory of FIG. 9.

Differences from the first preferred embodiment will be described hereinafter.

The inverted write word line 18 is provided in place of the write word line 4, and PMOS write transistors 22 and 24 are formed in series between the node N1 of the memory cell MC and the power supply voltage VDD. The PMOS write transistor 22 has a gate connected to the inverted write word line 18, and the PMOS write transistor 24 has a gate connected to the first column write line 12. PMOS write transistors 23 and 25 are formed in series between the node N2 of the memory cell MC and the power supply VDD. The PMOS write transistor 23 has a gate connected to the inverted write word line 18, and the PMOS write transistor 25 has a gate connected to the second column write line 13.

The NAND signal of the write bit line potential WBL and write enable potential CWE is applied to the first column write line 12. The OR signal of the write bit line potential WBL and inverted write enable potential $\overline{CWE}$ is applied to the second column write line 13.

Figure 8:
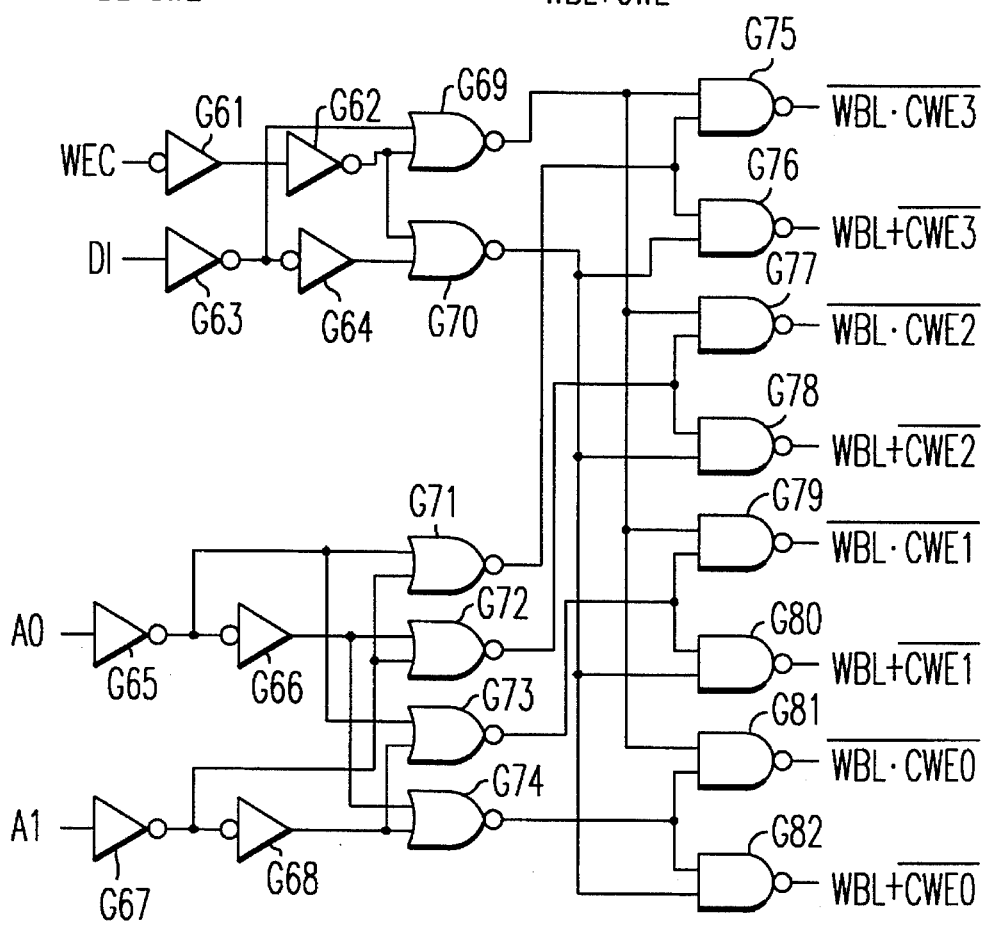
FIG. 8 is a circuit diagram showing the internal arrangement of the writing circuit of the third preferred embodiment.

FIG. 8 is a circuit diagram showing the internal arrangement of the writing circuit WC for applying the write signal to the first and second column write lines 12 and 13. The writing circuit WC includes inverters G61 to G68, NOR gates G69 to G74, and NAND gates G75 to G82, as shown in FIG. 8.

The write control signal WEC is applied to the NOR gates G69 and G70 through the inverters G61 and G62. The input data DI is transmitted to the NOR gate G69 through the inverter G63 and is transmitted to the NOR gate G70 through the inverters G63 and G64.

The (write) address A0 is applied to the inverter G65, which in turn outputs the inverted signal to the NOR gates G71 and G73. The (write) address A0 is also inputted to the NOR gates G72 and G74 through the inverters G65 and G66. The (write) address A1 is applied to the inverter G67, which in turn outputs the inverted signal to the NOR gates G71 and G72. The (write) address A1 is also inputted to the NOR gates G73 and G74 through the inverters G67 and G68.

The output of the NOR gate G69 is impressed on the NAND gates G75, G77, G79, G81. The output of the NOR gate G70 is impressed on the NAND gates G76, G78, G80, G82. The output of the NOR gate G71 is impressed on the NAND gates G75 and G76. The output of the NOR gate G72 is impressed on the NAND gates G77 and G78. The output of the NOR gate G73 is impressed on the NAND gates G79 and G80). The output of the NOR gate G74 is impressed on the NAND gates G81 and G82.

As a result, the output of the NAND gate G75 is $\overline{(WBL \cdot CWE3)}$; the output of the NAND gate G76 is (WBL+

$\overline{\text{CWE3}}$); the output of the NAND gate G77 is (WBL.$\overline{\text{CWE2}}$); the output of the NAND gate G78 is (WBL+$\overline{\text{CWE2}}$); the output of the NAND gate G79 is (WBL.$\overline{\text{CWE1}}$); the output of the NAND gate G80 is (WBL+$\overline{\text{CWE1}}$); the output of the NAND gate G81 is (WBL.$\overline{\text{CWE0}}$); and the output of the NAND gate G82 is (WBL+$\overline{\text{CWE0}}$).

The multi-port memory having such arrangements can perform the normal write operation even if the power supply voltage is low, with power consumption reduced, in the same manner as the first and second preferred embodiments.

The memory cells of 2-port arrangement are illustrated in the first to third preferred embodiments. The present invention, however, is applicable to memory cells of single-port arrangement.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory comprising:

a first power supply for supplying a first power supply voltage;

a second power supply for supplying a second power supply voltage lower than said first power supply voltage;

a plurality of memory cells arranged in a matrix, each including first and second inverters in which high and low logic levels are specified respectively by said first and second power supply voltages, said first and second inverters being cross connected at their input and output, an input of said first inverter being a first node and an input of said second inverter being a second node;

a plurality of first switching means of a predetermined conductivity type provided in corresponding relation to said plurality of memory cells and each formed between a write power supply which is one of said first and second power supplies and said first node, each of said plurality of first switching means including first and second transistors of said predetermined conductivity type connected in series between said write power supply and said first node, and each of said first switching means being capable of transmitting a write voltage of said write power supply when it is on;

a plurality of second switching means of said predetermined conductivity type provided in corresponding relation to said plurality of memory cells and each formed between said write power supply and said second node, each of said plurality of second switching means including third and fourth transistors of said predetermined conductivity type connected in series between said write power supply and said second node;

a plurality of row write lines corresponding to rows of said plurality of memory cells, said row write lines being connected to control electrodes of said first and third transistors in corresponding rows;

a plurality of first column write lines corresponding to said first nodes of said plurality of memory cells, said first column write lines being connected to control electrodes of said second transistors in corresponding columns;

a plurality of second column write lines corresponding to said second nodes of said plurality of memory cells, said column write lines being connected to control electrodes of said fourth transistors in corresponding columns; and write control means for selecting one of said plurality of memory cells as a selected memory cell on the basis of an external address signal and selecting respective ones of said first and second switching means which are in corresponding relation to said selected memory cell as selected first and second switching means, to turn on one of said selected first and second switching means and turn off the other selected switching means on the basis of external write data during a write operation, said write control means including:

row selecting means for selecting a row of said plurality of memory cells to be accessed on the basis of said address signal and setting a row write line corresponding to said row to be accessed to a first voltage at which said first and third transistors turn on;

column selecting means for selecting a column of said plurality of memory cells to be accessed on the basis of said address signal and selecting first and second column write lines corresponding to said column to be accessed as said selected first and second column write lines; and writing means for setting one of said selected first and second column write lines to a second voltage and setting the other selected column write line to a third voltage on the basis of said write data during a write operation, to turn on one of said second and fourth transistors which is connected to one selected column write line and to turn off the other transistor which is connected to the other selected column write line.

2. The semiconductor memory of claim 1, wherein said column selecting means and said writing means are formed integrally.

3. The semiconductor memory of claim 2, wherein said write power supply is said second power supply;

said predetermined conductivity type is an N type;

said first and second voltages are said first power supply voltage; and said third voltage is said second power supply voltage.

4. The semiconductor memory of claim 3, wherein said first, second, third, and fourth transistors are MOS transistors.

5. The semiconductor memory of claim 2, wherein said write power supply is said first power supply;

said predetermined conductivity type is a P type;

said first and second voltages are said second power supply voltage; and said third voltage is said first power supply voltage.

6. A semiconductor memory comprising:

a first power supply for supplying a first power supply voltage;

a second power supply for supplying a second power supply voltage lower than said first power supply voltage;

a plurality of memory cells each including first and second inverters in which high and low logic levels are specified respectively by said first and second power supply voltages, said first and second inverters being cross connected at their input and output, an input of said first inverter being a first node and an input of said second inverter being a second node;

a plurality of first switching means of a first conductivity type provided in corresponding relation to said plurality of memory cells and each formed between a first write power supply which is one of said first and second power supplies and said first node, each of said first switching means being capable of transmitting a first write voltage of said first write power supply when it is on;

a plurality of second switching means of a second conductivity type provided in corresponding relation to said plurality of memory cells and each formed between a second write power supply which is the other of said first and second power supplies and said first node, each of said second switching means being capable of transmitting a second write voltage of said second write power supply when it is on; and write control means for selecting one of said plurality of memory cells as a selected memory cell on the basis of an external address signal and selecting a pair of said first and second switching means which are in corresponding relation to said selected memory cell as selected first and second switching means, to turn on one of said selected first and second switching means and turn off the other selected switching means on the basis of external write data during a write operation.

7. The semiconductor memory of claim 6, wherein said plurality of memory cells are arranged in matrix form, said semiconductor memory further comprising:

a plurality of first row write lines corresponding to rows of said plurality of memory cells;

a plurality of second row write lines corresponding to the rows of said plurality of memory cells, said second row write lines being independent of said first row write lines;

a plurality of first column write lines corresponding to said first nodes of said plurality of memory cells; and a plurality of second column write lines corresponding to said first nodes of said plurality of memory cells, said second column write lines being independent of said first column write lines, each of said plurality of first switching means including first and second transistors of said first conductivity type connected in series between said first write power supply and said first node, said first row write lines being connected to the control electrode of said first transistors in the corresponding rows, said first column write lines being connected to the control electrode of said second transistors in corresponding columns, each of said plurality of second switching means including third and fourth transistors of said second conductivity type connected in series between said second write power supply and said first node, said second row write lines being connected to the control electrode of said third transistors in the corresponding rows, said second column write lines being connected to the control electrode of said fourth transistors in corresponding columns, said write control means including:

row selecting means for selecting a row to be accessed of said plurality of memory cells on the basis of said address signal to set a first row write line corresponding to said row to be accessed to a first voltage at which said first transistor turns on and to set a second row write line corresponding to said row to be accessed to a second voltage at which said third transistor turns on;

column selecting means for selecting a column to be accessed of said plurality of memory cells on the basis of said address signal to select first and second column write lines corresponding to said column to be accessed as said selected first and second column write lines; and writing means for setting one of said selected first and second column write lines to a third voltage and setting the other selected column write line to a fourth voltage on the basis of said write data in write operation, to turn on one of said second and fourth transistors which is connected to said one selected column write line and turn off the other transistor which is connected to the other selected column write line.

8. The semiconductor memory of claim 7, wherein said column selecting means and said writing means are formed integrally.

9. The semiconductor memory of claim 8, wherein said first write power supply is said second power supply;

said second write power supply is said first power supply;

said first conductivity type is an N type;

said second conductivity type is a P type;

said first voltage is said first power supply voltage;

said second voltage is said second power supply voltage; and said third and fourth voltages are equal.

10. The semiconductor memory of claim 9, wherein said first, second, third and fourth transistors are MOS transistors.

* * * * *